ced by examiner

United States Patent
Yoshikane (10) Patent No.: US 11,796,850 B2
(45) Date of Patent: Oct. 24, 2023

(54) DISPLAY DEVICE

(71) Applicant: SHARP KABUSHIKI KAISHA, Sakai (JP)

(72) Inventor: Tadaaki Yoshikane, Sakai (JP)

(73) Assignee: SHARP KABUSHIKI KAISHA, Sakai (JP)

( * ) Notice: Subject to any disclaimer, the term of this patent is extended or adjusted under 35 U.S.C. 154(b) by 48 days.

(21) Appl. No.: 17/725,414

(22) Filed: Apr. 20, 2022

(65) Prior Publication Data
US 2022/0342256 A1   Oct. 27, 2022

(30) Foreign Application Priority Data

Apr. 23, 2021 (JP) ................. 2021-073540

(51) Int. Cl.
*G02F 1/1333* (2006.01)
*H05K 5/02* (2006.01)

(52) U.S. Cl.
CPC .... *G02F 1/133382* (2013.01); *G02F 1/13332* (2021.01); *G02F 1/133314* (2021.01); *G02F 1/133385* (2013.01); *H05K 5/0213* (2013.01)

(58) Field of Classification Search
None
See application file for complete search history.

(56) References Cited

U.S. PATENT DOCUMENTS

2008/0088573 A1*  4/2008  Kim ............... G02F 1/133603
345/102

FOREIGN PATENT DOCUMENTS

JP    2017-151218 A    8/2017

* cited by examiner

*Primary Examiner* — Richard H Kim
(74) *Attorney, Agent, or Firm* — ScienBiziP, P.C.

(57) ABSTRACT

The display device includes a display panel, a first heating member, a second heating member, a housing, first and second chasses, first and second exhausters. The first exhauster includes a first exhaust port provided in the back surface of the housing, and exhausts air in a first internal space layer between the first chassis and the second chassis from a first exhaust port. The second exhauster exhausts air in a second internal space layer between the second chassis facing the second chassis in the housing and the back surface of the housing from a second exhaust port provided in the back surface of the housing. The first internal space layer and the second internal space layer are shielded from each other. The first exhauster exhausts the air in the first internal space layer from the first exhaust port through the exhaust duct shielded from the second internal space layer.

7 Claims, 9 Drawing Sheets

DISPLAY DEVICE

INCORPORATION BY REFERENCE

This application claims the priority based on Japanese Patent Application No. 2021-073540 filed on Apr. 23, 2021 under 35 USC 119, the contents of which are hereby incorporated herein.

BACKGROUND

The present disclosure relates to a display device.

For example, a document (Japanese Unexamined Patent Application Publication No. 2017-151218) discloses a cooling structure of cooling the inside of a housing of a display. In the display described in this document, a first support plate and a second support plate for supporting components such as a circuit board are disposed between a back surface of a display module and a housing back surface so as to face each other. On a surface on the second support plate side of the first support plate, the components such as the circuit board, a plurality of first fans for cooling the inside of the housing, and a second fan for cooling the housing are provided. On a surface on the housing back surface side of the second support plate, the components such as the circuit board are provided. The plurality of first fans and the second fan are disposed at regular interval in the longitudinal direction of the first support plate, and the second fan and each of the plurality of first fans are partitioned by a partition panel.

In the housing, a space between the first support plate and the second support plate (hereinafter, a first space), and a space between the second support plate and the housing back surface (hereinafter, a second space) are not completely partitioned, and the housing upper surface side and the bottom surface side communicate with each other. In the first support plate and the second support plate, a first air flow hole and a second air flow hole are provided at respective positions corresponding to each first fan and the second fan.

An intake hole that communicates the housing inside with the outside is provided in the bottom surface of the housing, external air is sucked into the first space from the intake hole in the housing bottom surface by driving of the first fans. The air sucked into the housing passes between the display module and the first support plate, and flows into the first fan through the first air flow hole of the first support plate. Then, the air that flows from the first fans passes through the first air flow hole of the second support plate, and is exhausted from an exhaust hole provided in the housing back surface to the outside. That is, the external air sucked by the first fans passes through the second space from the first space, is exhausted to the outside while including heat generated the display module, and the components supported by the first support plate and the second support plate.

An intake hole that communicates the second space with the outside is provide in the back surface of the housing, and external air is sucked into the second space from the intake hole of the housing back surface by driving of the second fan. The air sucked into the second space flows to the second fan through the second air flow hole of the second support plate, and the air that flows out from the second fan is exhausted from an exhaust hole provided in the housing upper surface to the outside through the second air flow hole of the first support plate. That is, the external air sucked from the housing back surface side by the second fan passes through the first space from the second space, and flows from the housing upper part to the outside.

SUMMARY

A display device according to the present disclosure includes a display panel, a first heating member, a second heating member, a housing, a first chassis, a second chassis, a first exhauster, and a second exhauster. The housing has a front surface disposed so as to expose the display panel, and a back surface on a side opposite to the front surface. The first chassis is disposed in the housing. The second chassis faces the first chassis and is disposed on a side of the back surface, in the housing. The first exhauster includes a first exhaust port provided in the back surface of the housing, and exhausts air in a first internal space layer from the first exhaust port to outside, the first internal space layer being an internal space formed between the first chassis and the second chassis. The second exhauster includes a second exhaust port provided in the back surface of the housing, and exhausts air in a second internal space layer from the second exhaust port to the outside, the second internal space layer being an internal space formed between the second chassis and the back surface of the housing. The first heating member is disposed in the first internal space layer. The second heating member is disposed in the second internal space layer. The first internal space layer and the second internal space layer are shielded from each other. The first exhauster includes an exhaust duct that penetrates the second chassis and is shielded from the second internal space layer, and exhausts the air in the first internal space layer from the first exhaust port through the exhaust duct.

DETAILED DESCRIPTION

Hereinafter, a display device according to an embodiment will be described with reference to the drawings. In the drawings, identical or equivalent parts are denoted by the same reference numerals, and description is not repeated.

First Embodiment

Figure 1:
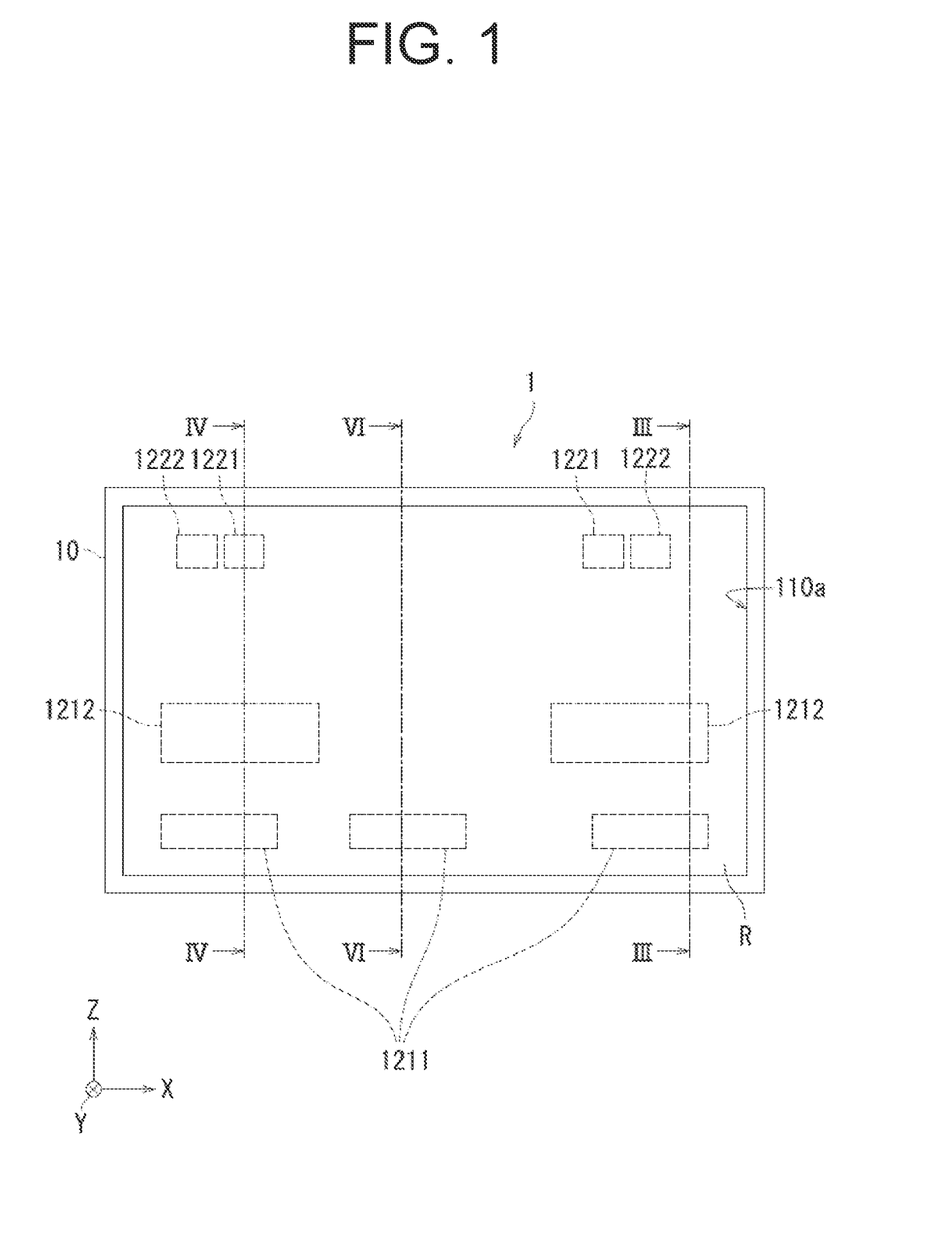
FIG. 1 is a schematic diagram illustrating appearance of a display device according to a first embodiment.

FIG. 1 is a schematic diagram illustrating appearance of a display device 1 according to a first embodiment. The display device 1 is a high-resolution display, for example, 8K. As illustrated in FIG. 1, the display device 1 includes a housing 10. A front surface (Y-axis negative direction side) of the housing 10 has an opening part 110a that exposes a display region R where an image is displayed. In addition, a back surface (Y-axis positive direction side) of the housing 10 has intake ports 1211 and 1212, and exhaust ports 1221 and 1222.

Figure 2:
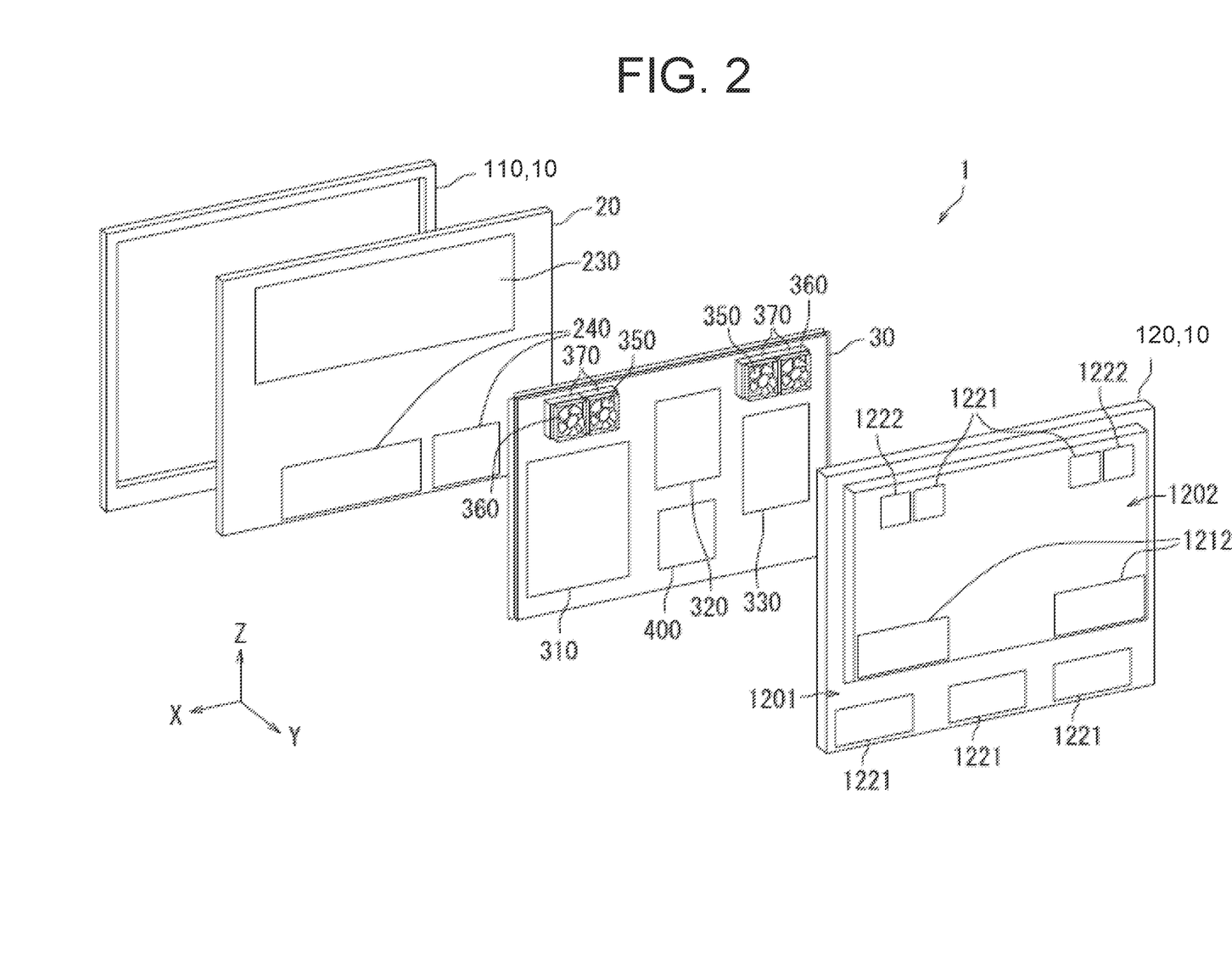
FIG. 2 is an exploded view of a schematic configuration of the display device illustrated in FIG. 1.
Figure 3:
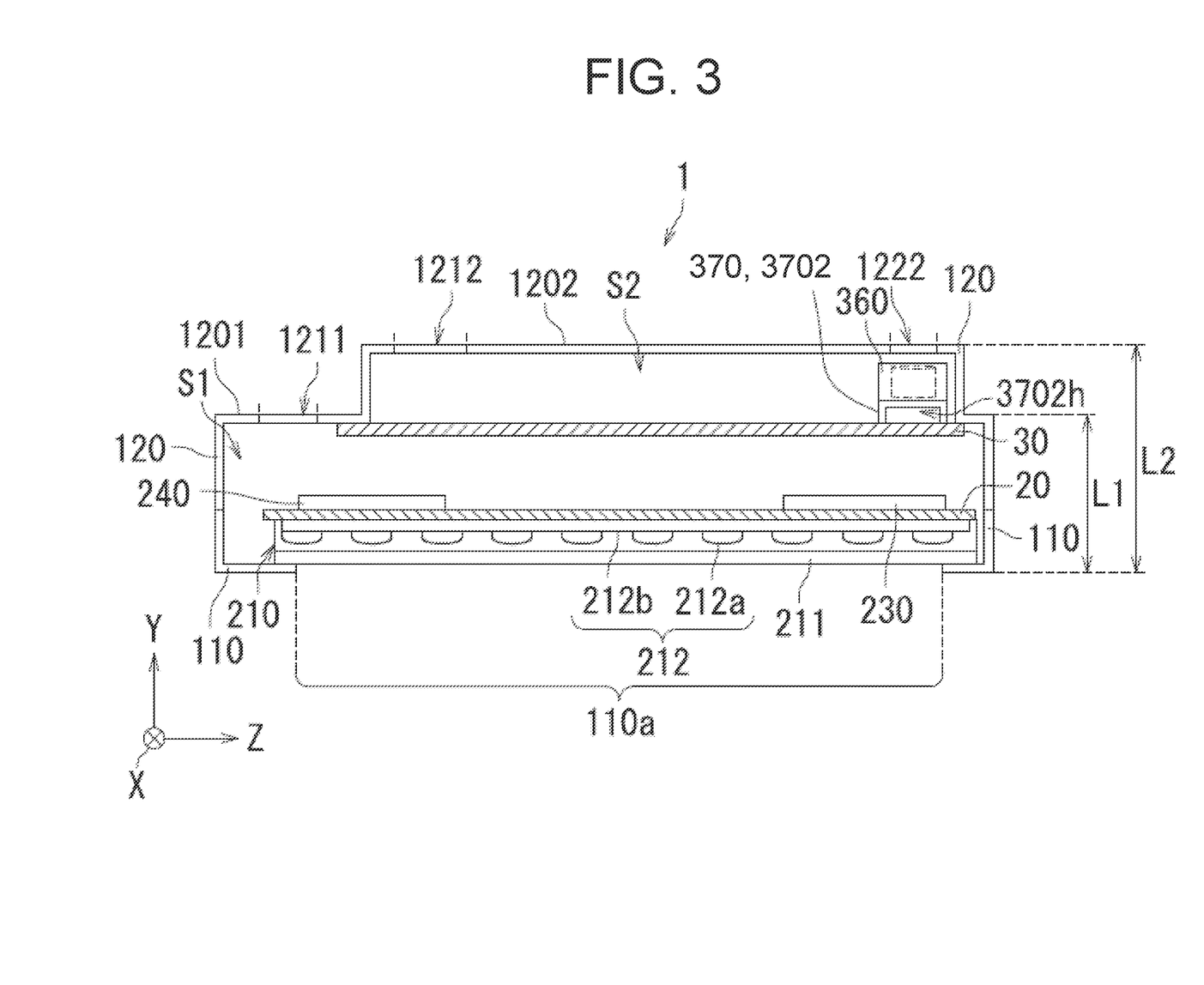
FIG. 3 is a sectional view illustrating a schematic cross section taken along the III-III line in FIG. 1.
Figure 4:
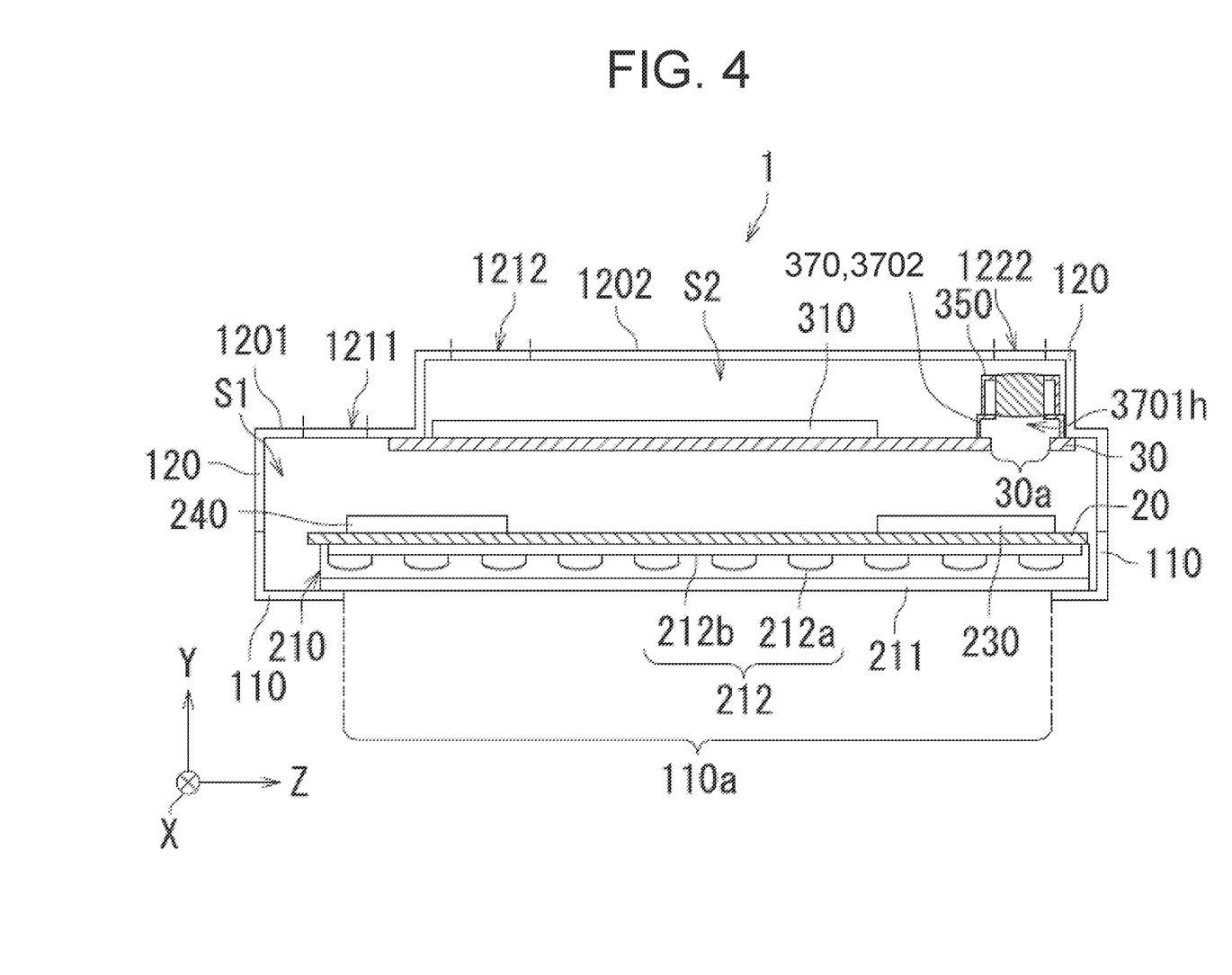
FIG. 4 is a sectional view illustrating a schematic cross section taken along the IV-IV line in FIG. 1.

FIG. 2 is an exploded view illustrating a schematic configuration of the display device 1 illustrated in FIG. 1. FIG. 3 is a sectional view illustrating a schematic cross section taken along the III-III line in FIG. 1. FIG. 4 is a sectional view illustrating a schematic cross section taken along the IV-IV line in FIG. 1. Hereinafter, an internal structure of the display device 1 will be specifically described with reference to FIG. 2 to FIG. 4.

As illustrated in FIG. 2 to FIG. 4, the display device 1 includes a front housing 110 and a back housing 120 as a housing 10, and a first chassis 20, and a second chassis 30. The first chassis 20 and the second chassis 30 are disposed between the front housing 110 and the back housing 120. Specifically, the first chassis 20 is provided on the front housing 110 side with respect to the second chassis 30, and the second chassis 30 is provided between the first chassis 20 and the back housing 120.

The projected area of the second chassis 30 is smaller than the projected area of the first chassis 20. The back housing 120 has a first back surface 1201 that covers the first chassis 20, and a second back surface 1202 that covers the second chassis 30. A step is formed between the first back surface 1201 and the second back surface 1202. As illustrated in FIG. 3, due to this step, the thickness 12 from the front surface (Y-axis negative direction side) of the front housing 110 to the second back surface 1202 is thicker than the thickness L1 from the front surface (Y-axis negative direction side) of the front housing 110 to the first back surface 1201. At a position of the step in the back housing 120, a surface on the back housing 120 side in the second chassis 30 is in contact with an inner surface of the back housing 120.

The display device 1 has a first internal space S1 (an example of a first internal space layer) and a second internal space S2 (an example of a second internal space layer) in the housing 10, and the second chassis 30 is disposed between the first internal space S1 and the second internal space S2. The first internal space S1 is an internal space on the first chassis 20 side, and the second internal space S2 is an internal space on the back housing 120 side.

Furthermore, the display device 1 includes a display module 210, a display control circuit board 230, an LED (Light-Emitting Diode) driving circuit board 240, a main board 310, an image processing circuit board 320, a power supply unit 330, a plurality of fan installation members 370, a plurality of first fans 350, and a plurality of second fans 360, in the housing 10. The display module 210, the display control circuit board 230, the LED driving circuit board 240, the main board 310, the image processing circuit board 320, and the power supply unit 330 are an example of a heating member that generates heat.

The display module 210, the display control circuit board 230, the LED driving circuit board 240, the image processing circuit board 320, the power supply unit 330, the plurality of first fans 350, and the plurality of second fans 360 are electrically connected to the main board 310.

As illustrated in FIG. 2, a first chassis 20 supports first heating members such as the display module 210, the display control circuit board 230, and the LED driving circuit board 240. As illustrated in FIG. 3 and FIG. 4, in the first chassis 20, the display module 210 is disposed on a front housing 110 side, and the first heating members such as the display control circuit board 230 and the LED driving circuit board 240 are disposed on a back housing 120 side. The display module 210 is disposed in contact with the front housing 110 such that the display region R of the display module 210 is exposed from the opening part 110a of the front housing 110.

As illustrated in FIG. 3 and FIG. 4, the display module 210 includes a display panel 211 and a backlight 212. In this embodiment, the display panel 211 is a liquid crystal display panel. The display panel 211 is electrically connected to the display control circuit board 230. The display control circuit board 230 includes a display panel drive circuit such as a driver and a timing controller for driving the display panel 211.

The backlight 212 is a directly under type backlight that irradiates an entire back surface of the display panel 211 with light. The backlight 212 includes a plurality of LEDs 212a, and an LED substrate 212b that supports the plurality of LEDs 212a. The backlight 212 includes an optical member (not illustrated) such as a reflective sheet for allowing light to enter the display panel 211. The backlight 212 is electrically connected to the LED driving circuit board 240. The LED driving circuit board 240 is electrically connected to the display control circuit board 230, and includes an LED drive circuit (not illustrated) that turns on or off the plurality of LEDs 212a under control of the display control circuit board 230.

As illustrated in FIG. 2, a second chassis 30 supports second heating members such as the main board 310, the image processing circuit board 320, and the power supply unit 330, in the back housing 120. In addition, as illustrated in FIG. 2, the second chassis 30 supports two sets of fan installation members 370 disposed apart from each other on the back housing 120 side. A bottom of each fan installation member 370 is connected to the second chassis 30, and a pair of a first fan 350 and a second fans 360 are installed in an upper part of each fan installation member 370.

The main board 310 includes a control circuit including a CPU (Central Processing Unit), a memory (ROM (Read Only Memory) and a RAM (Random Access Memory)), a communication interface circuit for communicating with an external device, and the like (all not illustrated). The image processing circuit board 320 includes an image processing circuit (not illustrated) that adjusts the color, the brightness, and the like of a display image under control of the main board 310. The power supply unit 330 is electrically connected to each part of the display device 1 and supplies power to each connected part. In two pairs of the first fan 350 and the second fan 360, the rotation operation of the fans starts or stops under control of the main board 310. The first fans 350 are used to exhaust air in a first internal space S1, and the second fans 360 are used to exhaust air in a second internal space S2. Hereafter, the respective fan installation members disposed on the X-axis positive direction side and the X-axis negative direction side in the second chassis 30 are sometimes referred to as the fan installation members 370R and 370L.

Figure 5A:
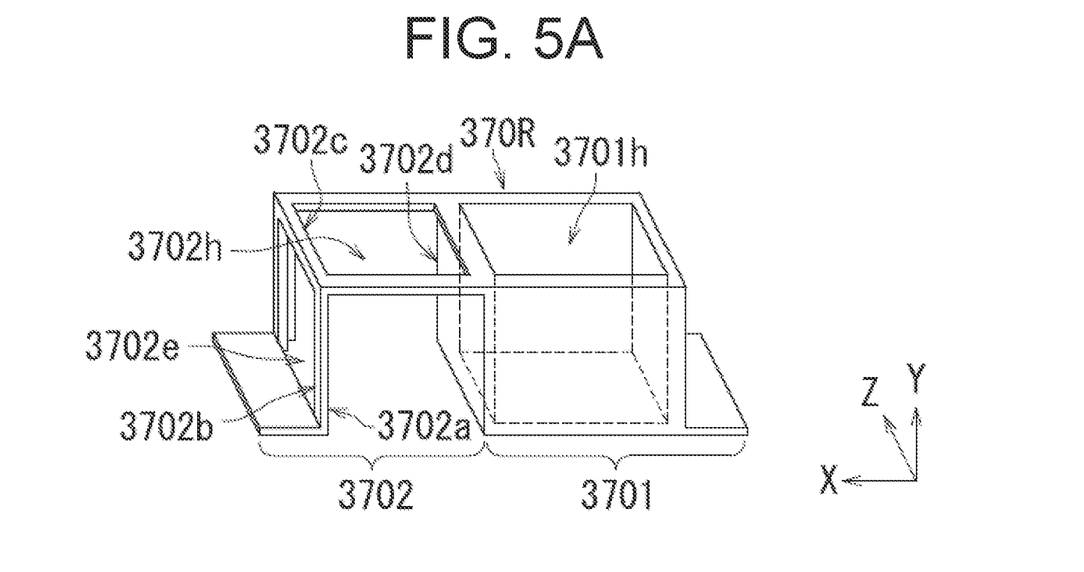
FIG. 5A is a schematic diagram illustrating a fan installation member in the first embodiment.
Figure 5B:
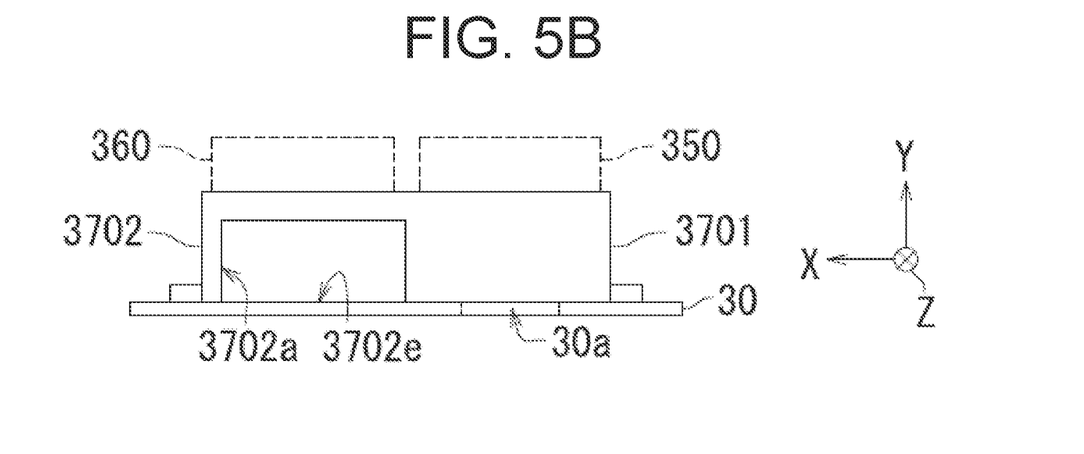
FIG. 5B is a schematic diagram of the fan installation member illustrated in FIG. 5A, viewed from the Z-axis negative direction side.
Figure 5C:
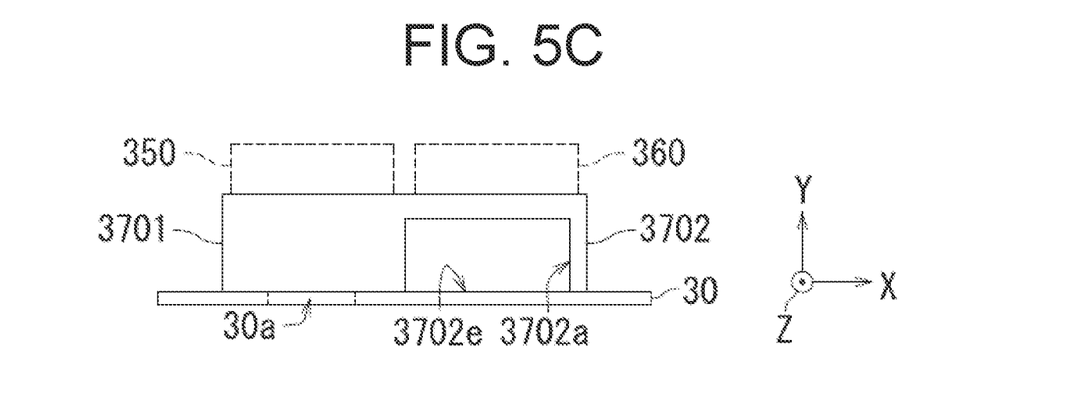
FIG. 5C is a schematic diagram of the fan installation member illustrated in FIG. 5A, viewed from the Z-axis positive direction side.
Figure 5D:
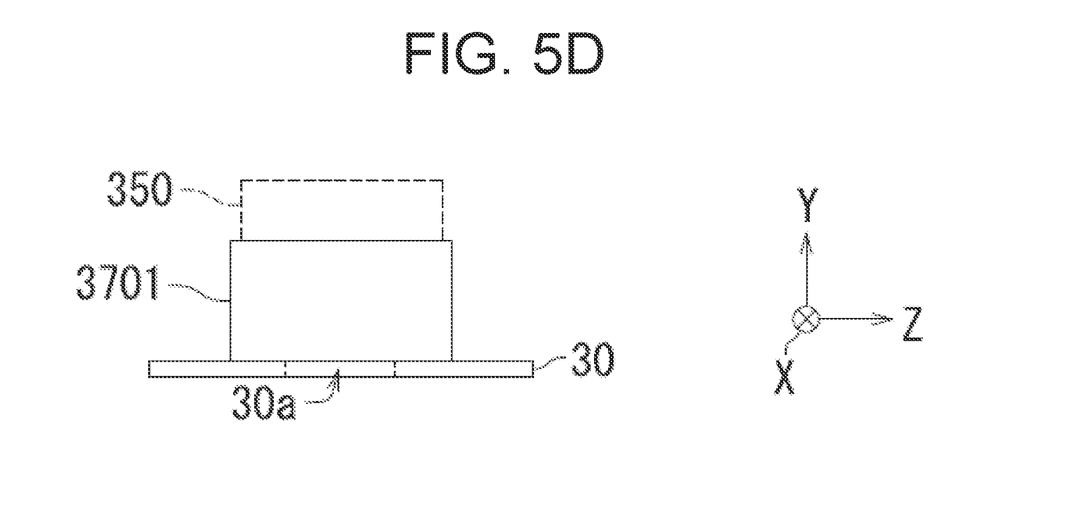
FIG. 5D is a schematic diagram of the fan installation member illustrated in FIG. 5A, viewed from the X-axis negative direction side.
Figure 5E:
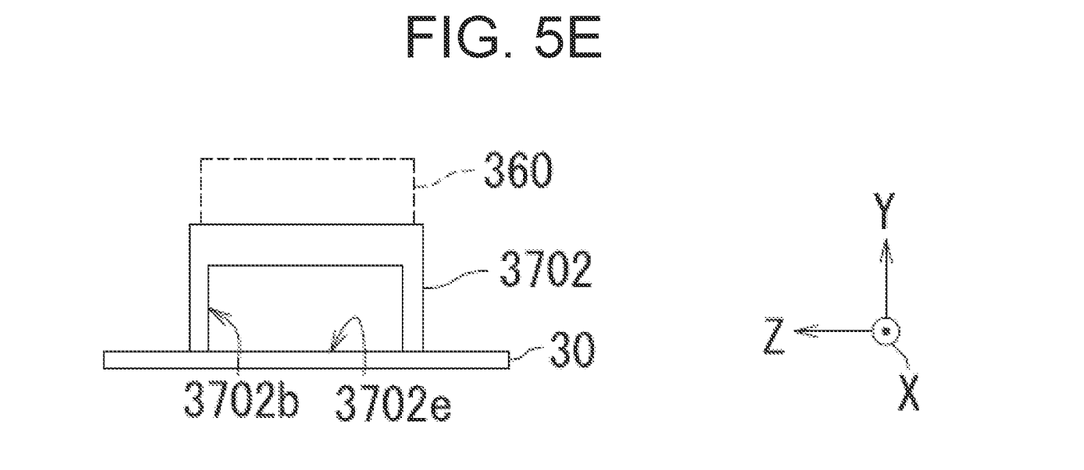
FIG. 5E is a schematic diagram of the fan installation member illustrated in FIG. 5A, viewed from the X-axis positive direction side.

FIG. 5A to FIG. 5E are schematic diagrams each illustrating a structure of the fan installation member 370R. FIG. 5A is a schematic diagram illustrating the fan installation member 370R. FIG. 5B is a schematic diagram of the fan installation member 370R illustrated in FIG. 5A, viewed from the Z-axis negative direction side, FIG. 5C is a schematic diagram of the fan installation member 370R illustrated in FIG. 5A, viewed from the Z-axis positive direction side. FIG. 5D is a schematic diagram of the fan installation member 370R illustrated in FIG. 5A, viewed from the X-axis negative direction side. FIG. 5E is a schematic diagram of the fan installation member 370R illustrated in FIG. 5A, viewed from the X-axis positive direction side.

As illustrated in FIG. 5A to FIG. 5E, the fan installation member 370R has a first installation part 3701 and a second installation part 3702. The first installation part 3701 has a hollow substantially quadrangular prism shape and has a hollow region 3701h that penetrates in the Y-axis direction. As illustrated in FIG. 5B to FIG. 5D, the second chassis 30 has an opening 30a that penetrates the second chassis 30 at a position facing the first installation part 3701. The hollow region 3701h of the first installation part 3701 communicates with the first internal space S1 via the opening 30a. The first fan 350 is disposed on an upper surface of the first installation part 3701 (on the Y-axis positive direction side). A region between the opening 30a and the first fan 350 is shielded from the second internal space S2 by the first installation part 3701. Therefore, an airflow is formed from the first internal space S1 toward a bottom of the first fan 350 through the opening 30a and the hollow region 3701h of the first installation part 3701 by driving of the first fan 350. That is, the first installation part 3701 and the opening 30a of the second chassis 30 is an example of an exhaust duct that guides the air in the first internal space S1 to the first fan 350. The air in the first internal space S1 does not mix with the air in the second internal space S2 by the first installation part 3701 and the opening 30a.

As illustrated in FIG. 5A to FIG. 5E, the second installation part 3702 has a substantially quadrangular prism shape and, and has opening parts 3702a to 3702e in all surfaces except a surface serving as a boundary between the first installation part 3701 and the second installation part 3702. As illustrated in FIGS. 5B, 5C, and 5E, the opening part 3702e in a bottom of the second installation part 3702 is blocked by the second chassis 30. That is, the insides 3702h of the second installation part 3702 communicates with the second internal space S2, but does not communicate with the first internal space S1. The second fan 360 is disposed on an upper surface of the second installation part 3702. Therefore, an airflow is formed from the second internal space S2 toward a bottom of the second fan 360 through the opening parts 3702a to 3702d of the second installation part 3702 by driving of the second fan 360.

Although not illustrated in the drawings, the fan installation member 370L has a structure in which the positions of the first installation part 3701 and the second installation part 3702 of the fan installation member 370R are reversed.

Figure 6:
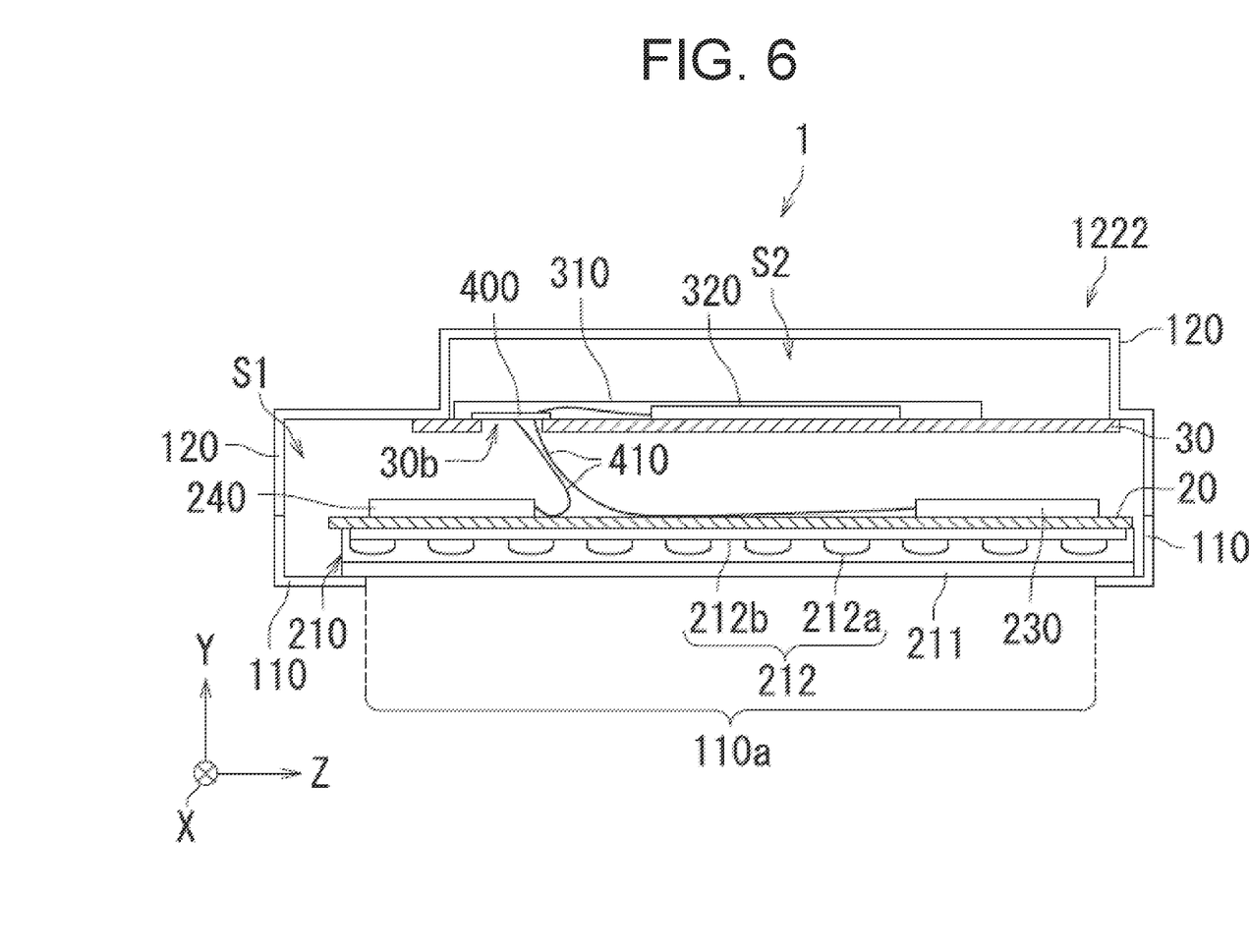
FIG. 6 is a schematic sectional view taken along the VI-VI illustrated in FIG. 1.

FIG. 6 is a schematic sectional view taken along the VI-VI line illustrated in FIG. 1. As illustrated in FIG. 2 and FIG. 6, the display device 1 further includes a blocking member 400 and a plurality of wires 410 in the housing 10. The blocking member 400 is provided on a surface on the back housing 120 side of the second chassis 30. The blocking member 400 is composed of an insulating material. As illustrated in FIG. 6, the second chassis 30 has an opening part 30b for wiring in a region where the blocking member 400 is provided. In the opening part 30b for wiring, the image processing circuit board 320 (an example of the second heating member) and the display control circuit board 230 (an example of the first heating member) are connected by the wire 410. In addition, the main board 310 and the power supply unit 330 (an example of the second heating member), and the display control circuit board 230 and the LED driving circuit board 240 (an example of the first heating members) are connected by the wires 410. The blocking member 400 covers the opening part 30b for wiring through which the wires 410 pass. Thus, in this embodiment, the wires 410 connecting the first heating members disposed on the first chassis 20, and the second heating members disposed on the second chassis 30 are consolidated in one place.

Returning to FIG. 2 to FIG. 4, the intake ports 1211 and 1212 and the exhaust ports 1221 and 1222 are provided in the back housing 120. Specifically, intake ports 1211 (an example of a first intake port and a first intake part) are disposed in the first back surface 1201 of the back housing 120, and the intake ports 1212 (an example of a second intake port and a second intake part) and the exhaust ports 1221 and 1222 are disposed in the second back surface 1202. The first internal space S1 and the outside communicate with each other by the intake ports 1211, and external air is taken into the first internal space S1. The second internal space S2 and the outside communicate with each other by the intake ports 1212, and external air is taken into the second internal space S2.

As illustrated in FIG. 4, the exhaust ports 1221 (an example of the first exhaust port) are provided so as to face the first fans 350, and air sent out from the first fans 350 is exhausted. Specifically, as illustrated in FIG. 4, air in the first internal space S1, which flows into the first fans 350 through the openings 30a and the hollow regions 3701h of the first installation parts 3701, is exhausted from the exhaust ports 1221 by driving of the first fans 350. That is, the openings 30a, the first installation parts 3701, the first fans 350, and the exhaust ports 1221 are an example of a first exhauster in this embodiment.

In addition, as illustrated in FIG. 3, the exhaust ports 1222 (an example of a second exhauster) are provided so as to face the second fan 360, and air sent out from the second fans 360 is exhausted through the exhaust ports 1222. Specifically, as illustrated in FIG. 3, air in the second internal space S2, which flows into the second fans 360 through the insides 3702h of the second installation parts 3702, is exhausted from the exhaust ports 1222 by driving of the second fans 360. That is, the second installation part 3702, the second fans 360 and the exhaust ports 1222 are an example of a second exhauster in this embodiment.

In this embodiment, the inside of the housing 10 of the display device 1 is separated by the first chassis 20 and the second chassis 30, and the first internal space S1 and the second internal space S2 are formed on the front surface side and the back surface side of the housing 10, respectively. In the second internal space S2, the first fans 350 for exhausting the air in the first internal space S1, and the second fans 360 for exhausting the air in the second internal space S2 are provided. However, the airflow formed by each fan passes through a different internal space.

Figure 7A:
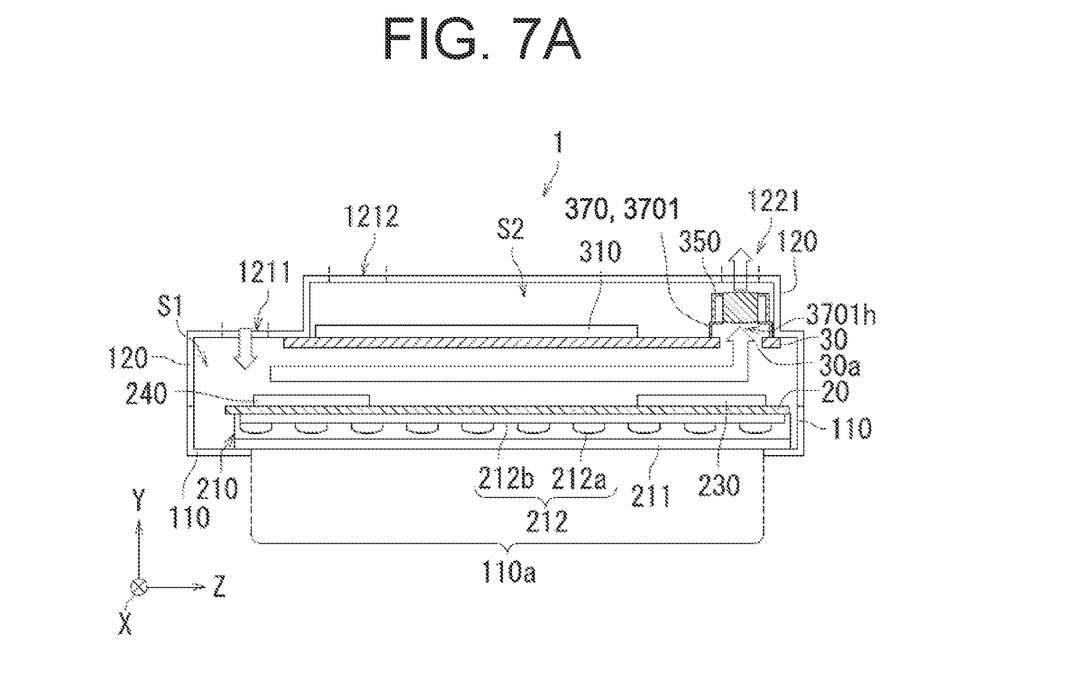
FIG. 7A is a diagram illustrating a path of an airflow generated by driving of a first fan.
Figure 7B:
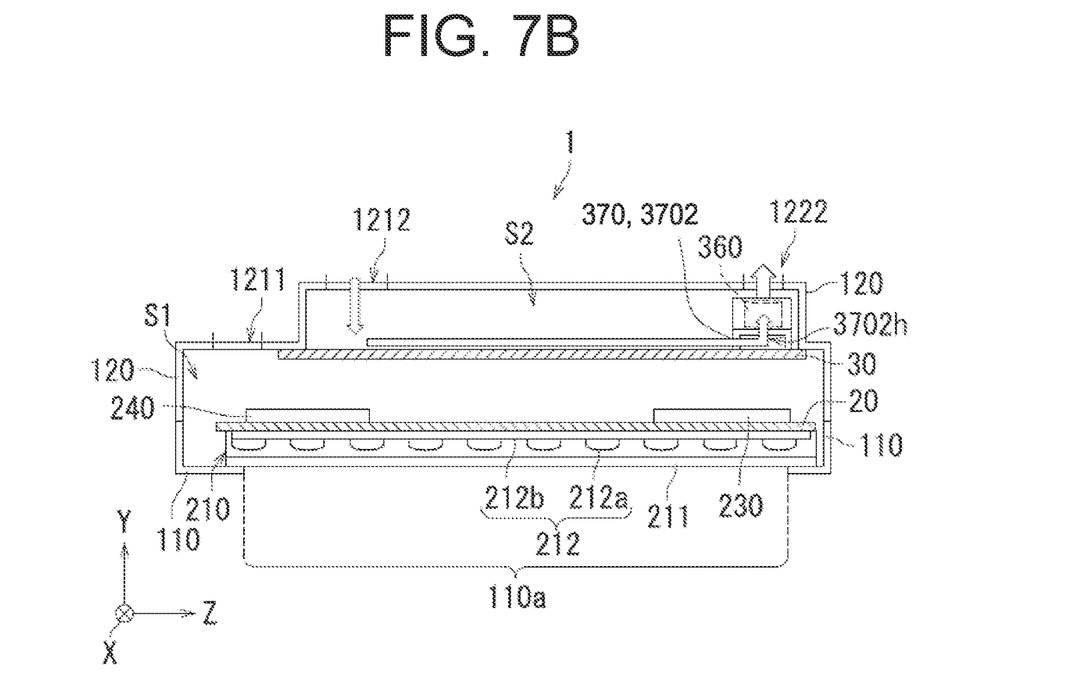
FIG. 7B is a diagram illustrating a path of an airflow generated by driving of a second fan.

FIG. 7A is a diagram illustrating a path of the airflow generated by driving of the first fan 350, and FIG. 7B is a diagram illustrating a path of the airflow generated by driving of the second fan 360. The airflow that passes the path illustrated by the arrow in FIG. 7A and is generated by the first fan 350 passes through the first internal space S1 from the intake port 1211, passes through the hollow region 3701h of the first installation part 3701 from the opening 30a of the second chassis 30 to flow into the first fan 350, and goes from the exhaust port 1221 to the outside. In addition, the airflow that passes the path illustrated by the arrow in FIG. 7B and is generated by the second fan 360 passes through the second internal space S2 from the intake port 1212, passes through an inside 3702h of the second installation part 3702 to flow into the second fan 360, and goes from the exhaust port 1222 to the outside. Thus, by the driving of the first fans 350 and the second fans 360, the air in the first internal space S1 and the air in the second internal space S2 do not mix with each other, and the air in each internal space is individually exhausted to the outside. Therefore, it is possible to efficiently cool heat, generated by each of the heating members provided in the first internal space S1 and the second internal space S2.

Second Embodiment

Figure 8:
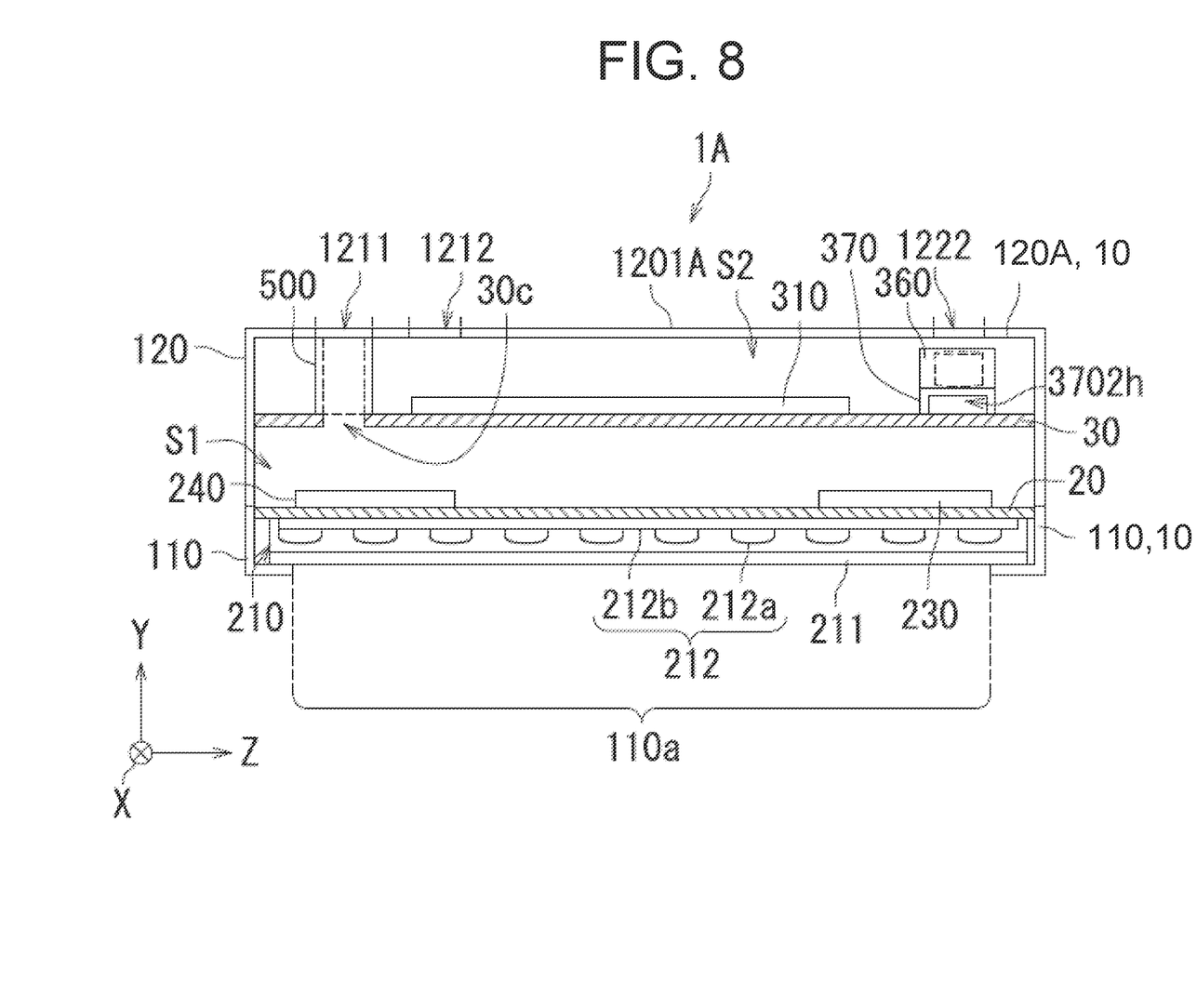
FIG. 8 is a sectional view illustrating a schematic configuration of a display device in a second embodiment.

In the second embodiment, a structure of a display device in a case where projected areas of a second chassis 30 and a first chassis 20 are equal will be described. FIG. 8 is a sectional view illustrating a schematic configuration of a display device 1A in this embodiment. In FIG. 8, the same configurations as the first embodiment are denoted by the same reference numerals as the first embodiment. In the following, configurations different from those of the first embodiment will be mainly described.

As illustrated in FIG. 8, the display device 1A has a front housing 110 and a back housing 120A, as a housing 10. In addition, the display device 1A has a second chassis 30A having substantially the same projected area as a first chassis 20. The second chassis 30A faces the first chassis 20, and is disposed on the back housing 120A side with respect to the first chassis 20.

The back housing 120A has a substantially flat back surface 1201A facing the second chassis 30A. In the back surface 1201A, intake ports 1211 and 1212, and exhaust ports 1222 are provided. Although not illustrated in FIG. 7, similarly to the first embodiment, exhaust ports 1221 (see FIGS. 1 and 2, and the other drawings) adjacent to the exhaust ports 1222 are provided in the back surface 1201A.

The second chassis 30A has intake opening parts 30c that penetrate the second chassis 30A, at positions corresponding to the intake ports 1211. The display device 1A has intake ducts 500 between a surface on the back surface 1201A side in the second chassis 30A and the back housing 120A. The intake opening parts 30c and the intake ducts 500 are an example of a first intake in this embodiment.

The intake ducts 500 each has a hollow cylindrical shape. Each intake duct 500 has an end connected to the intake opening part 30c, and the other end connected to the intake port 1211. That is, the outside and the first internal space S1 communicate with each other through the intake ducts 500. Therefore, external air passes through the inside of each intake duct 500, and is sucked into the first internal space S1 by driving of first fans 350.

With the structure illustrated in FIG. 8, an airflow formed by each first fan 350, and an airflow formed by each second fan 360 do not generate in the same internal space. Therefore, air in a first internal space S1 and air in a second internal space S2 do not mix with each other, and individually exhaust to the outside, so that it is possible to efficiently cool heat generated by heating members provided in the first internal space S1 and the second internal space S2.

As described above, the embodiment according to the present disclosure is described. The present disclosure is not limited to the above embodiment, and can be carried out in various embodiments without deviating from the gist. In order to facilitate understanding, each component is schematically mainly illustrated in the drawings, and the thickness, the length, the number, and the like of each component illustrated in the drawings are different from the actual one due to the convenience of the drawings. In addition, the shape, the dimensions, and the like of each component illustrated in the above embodiment are merely examples, and are not particularly limited, and various changes can be made within a range that does not substantially deviate from the effect of present disclosure.

(1) Each of the display devices 1 and 1A is not limited to a display device using liquid crystal, and may be a display device using organic EL (Electro Luminescence).

(2) The position and the number of each of the first fan 350, the second fan 360, the exhaust ports 1221 and 1222, and the intake ports 1211 and 1212 are not limited to the embodiments. In the display device, at least one intake port, at least one exhaust port, and at least on fan only needs to be provided in each of the first internal space S1 and the second internal space S2.

The invention claimed is:

1. A display device comprising:
   a display panel;
   a first heating member;
   a second heating member;
   a housing having a front surface disposed so as to expose the display panel, and a back surface on a side opposite to the front surface;
   a first chassis disposed in the housing;
   a second chassis facing the first chassis and disposed on a side of the back surface, in the housing;
   a first exhauster that includes a first exhaust port provided in the back surface of the housing, and exhausts air in a first internal space layer from the first exhaust port to outside, the first internal space layer being an internal space formed between the first chassis and the second chassis; and
   a second exhauster that includes a second exhaust port provided in the back surface of the housing, and exhausts air in a second internal space layer from the second exhaust port to the outside, the second internal space layer being an internal space formed between the second chassis and the back surface of the housing, wherein
   the first heating member is disposed in the first internal space layer,
   the second heating member is disposed in the second internal space layer,
   the first internal space layer and the second internal space layer are shielded from each other,
   the first exhauster includes an exhaust duct that penetrates the second chassis and is shielded from the second internal space layer, and exhausts the air in the first internal space layer from the first exhaust port through the exhaust duct.

2. The display device according to claim 1, wherein the first exhauster includes a first fan that sends out the air in the first internal space layer to the first exhaust port through the exhaust duct; and the second exhauster includes a second fan that sends out the air in the second internal space layer to the second exhaust port.

3. The display device according to claim 1, further comprising:
    a first intake that includes a first intake port provided in the back surface of the housing, and allows air in the outside to be sucked into the first internal space layer from the first intake port; and
    a second intake that includes a second intake port provided in the back surface of the housing, and allows air in the outside to be sucked into the second internal space layer from the second intake port.

4. The display device according to claim 3, wherein
    an projected area of the first chassis is larger than an projected area of the second chassis,
    the back surface of the housing includes a first back surface covering a partial region that does not overlap with the second chassis in the first chassis, and a second back surface covering the second chassis,
    the first intake port is provided in the first back surface, and
    the second intake port is provided in the second back surface.

5. The display device according to claim 4, wherein
    a thickness between the front surface and the first back surface is smaller than a thickness between the front surface and the second back surface.

6. The display device according to claim 3, wherein
    the first intake includes intake duct that penetrates the second chassis and the second internal space layer, and is shielded from the second internal space layer, and allows air in the outside to be sucked into the first internal space layer through the intake duct.

7. The display device according to claim 1, further comprising:
    a wire that connects the first heating member in the first internal space layer and the second heating member in the second internal space layer; and
    a blocking member, wherein
    the second chassis has an opening part for wiring,
    the wire passes the opening part for wiring, and connects the first heating member and the second heating member, and
    the blocking member closes a region other than a portion, through which the wire passes, in the opening part for wiring.

* * * * *